United States Patent [19]
Matthee et al.

[11] Patent Number: 6,042,886
[45] Date of Patent: Mar. 28, 2000

[54] METHOD FOR THE MANUFACTURING OF A COATING ON A GRINDING TOOL

[75] Inventors: Thorsten Matthee, Meine; Lothar Schäfer, Meino-Abbesbüttel, both of Germany

[73] Assignee: Fraunhofer-Gesellschaft zur Forderung der Angewandten Forschung e.V., Munich, Germany

[21] Appl. No.: 09/061,920

[22] Filed: Apr. 17, 1998

[30] Foreign Application Priority Data

Apr. 18, 1997 [DE] Germany ............ 197 16 330

[51] Int. Cl.⁷ .................................................. C23C 16/26
[52] U.S. Cl. .................. 427/249.11; 427/249.8; 427/309; 51/293; 407/119
[58] Field of Search ............. 427/249.11, 309, 427/249.8, 249.2; 51/293; 407/119

[56] References Cited

FOREIGN PATENT DOCUMENTS 3-117561  5/1991  Japan .

OTHER PUBLICATIONS

Lexikon der Fertigungstechnik und Arbeitsmaschinen A–K and L–Z (vol. 8 and 9), 1967 No page and month data.

Primary Examiner—Roy V. King
Attorney, Agent, or Firm—Salter & Michaelson

[57] ABSTRACT

In a method for the manufacture of a coating on a grinding tool, a rough diamond layer (8, 10) is produced as an abrasive layer on the surface (2) of the body (1) of the grinding tool by vapor-phase deposition. This diamond layer is deposited on the grinding tool by the Hot Filament Chemical Vapor Deposition (HF-CVD) process.

22 Claims, 3 Drawing Sheets

METHOD FOR THE MANUFACTURING OF A COATING ON A GRINDING TOOL

BACKGROUND OF THE INVENTION

1. Field of the Invention

This invention relates to a method for the manufacture of a coating on a grinding tool.

2. Discussion of the Related Art

It is known that grinding tool can be provided with a coating, for example a diamond layer. Here the surface morphology of the coating is invariably modified in such a way that a smooth layer is deposited on the body. To create an appropriate cutting space for the grinding, the body is given a structure, for example, an external thread. The diamond layer deposited on the body, being a smooth layer, has the tack of providing protection against wear and a cutting material for the machining, for as a rule stable cutting edges and low coefficients of friction are required.

In this connection DE 43 39 326 A1 disclosed a dressing roll and not a grinding tool for grinding wheels. The body of the dressing roll is given a thread profile having a depth of teeth of about 1 mm. Onto this are vapor deposited diamond layers having a thickness of 50 $\mu$m to 500 $\mu$m. This smooth diamond layer together with the threads forms cutting edges for the dressing roll and there is sufficient cutting space in the indentations in the threads.

The use of an abrasive layer containing individual diamond granules in a metallic binder phase is also known. The binder phase can be applied galvanically and, besides anchoring the diamond granules, provides for the intended amount of wearing away. The cutting space in these tools is formed because the because the binder phase wears away and the diamond granules then have an excess length in relation to the latter. The profiling of these tools is very time-consuming and requires much experience.

A method of treating surface by means of a plasma-enhanced deposition of diamond layers is known from WO 96/41897 A2. The theoretical possibility of producing grinding wheels in this way is mentioned in that document.

WO 96/30557 A1 also mentions the possibility of depositing diamond onto a grinding tool by means of a plasma-enhanced coating process.

Neither document gives any practical information at all as to whether it is in fact possible to produce a grinding tool in this way; it is very doubtful whether a precise definition of properties of the grinding tool to be produced by plasma-enhanced processes can be achieved.

SUMMARY OF THE INVENTION

The present invention was based on the object of creating a new method for the manufacture of a coating on a grinding tool, whereby a diamond coating is provided as the abrasive layer.

This object is achieved by a method whereby a rough diamond coating or diamond layer is produced as an abrasive layer on the surface of a body (1) of the grinding tool by vapor-phase deposition and whereby this diamond layer is deposited on the grinding tool by the Hot Filament Chemical Vapor Deposition (HF-CVD) process. A tedious and costly profiling of the metal-bonded diamond layer as in the case of the known diamond grinding tool is no longer necessary. Diamond layers to be applied by the Hot Filament Chemical Vapor Deposition (HF-CVD) process can be easily and accurately deposited onto the contours of a body to be treated. If one selects a smooth body bearing a rough diamond layer which has been deposited on the body by the HF-CVD process, then even without a binder phase such as, for example, cobalt, a cutting space sufficiently large for the fine machining of workpieces is achieved.

It also proves advantageous that a tool which may be worn out after frequent use, in which the body has been exposed and the diamond coating has been worn away, can be recoated by the HF-CVD process.

To the person skilled in the art, it appears particularly astonishing and in principle incorrect that a pure diamond layer can serve as a grinding layer. The roughness of the layer can be advantageously adjusted and preferably accommodated to the intended use.

Unlike prior art, wherein as little surface roughness as possible is set as the target in order to produce surfaces which are as smooth as possible during grinding, in the method according to the invention as great a roughness as possible is established in order to create as large a cutting space as possible, which is desirable during the working of the surface. An insufficient cutting space would lead in fact to the reincorporation of chips into the surface to be worked and to other disturbances in the function of the grinding tool. According to the invention, sufficient cutting space is now available and at the same time, through the coating made of diamond but in the micro range, it is on the other hand ensured that a smooth and excellent surface is nevertheless formed on the finished workpiece. Accordingly the roughening of the tool, contrary to the prejudice of the person skilled in the art, does not have a counterproductive effect here. This can be verified by means of tests.

In principle, a method for the manufacture of a coating on a grinding tool is created, whereby a rough diamond coating is produced as an abrasive layer on the surface of the grinding tool by vapor-phase deposition. The Hot Filament Chemical Vapor Deposition (HF-CVD) process is provided, with successful results. Here the diamond layer is directly deposited preferably as a closed layer of pure phase onto the body of the grinding tool. It also proves very advantageous to deposit the diamond layer in combination with small quantities of graphitically bonded carbon. The graphitically bonded carbon in the HF-CVD diamond layer can first of all wear away and gradually release the cutting space provided between the diamond crystals.

On the other hand, the diamond layer can be deposited onto a smooth body. On the other had, the body is preferably roughened before the deposition of the diamond layer. This can be done, for example, by sandblasting, by working with a file, grinding wheel or brush or even by machining with a lapping wheel. For machining with a lapping wheel, preferably a very large grain size is chosen, in particular a grain size of >>10 $\mu$m and particularly preferably of about 213 $\mu$m. Such a course grain size is extremely unusual for lapping, which is normally carried out with particle sizes of a few $\mu$m. Such a coarse grain size would normally never be considered by a person skilled in this field. However, it proves advantageous in the present case, because not only is an increase in the surface roughness thereby achieved, but in addition in this way a necessary preliminary nucleation of the surface of the body to be coated is effected at the same time. A preliminary nucleation of the body is preferably carried out with the use of granular diamond material or diamond tools during the roughening of the body. This dispenses with one operation in the manufacture of the tool, with corresponding advantages as regards costs and time.

Alternatively, a porous body can also be used for roughening the smooth body. This porous material already has its own roughened surface.

Through the roughening of the body, the CVD diamond layer is also well anchored mechanically to the body and exhibits a good bonding thereto.

During the roughening of the body of the grinding tool, care should be taken that the tolerances to be met by the tool are not exceeded, as in most cases precision tools are coated. The roughening should in any case be so gauged that the diamond layer just bonds satisfactorily.

The actual deposition process contributes to the creation of a rough CVD diamond layer. Unlike prior art, the deposition process is adjusted so that as rough a layer as possible, corresponding to a (111) or (110) texture, is produced. As many points as possible are therefore to be exposed. To achieve as large a cutting space as possible, the grains forming the individual points should grow as large as possible. Here care should be taken particularly to ensure that a secondary nucleation is avoided. A secondary nucleation involves the formation and growth of smaller crystals on the surface of the large grains or of the diamond crystals. The growth of smaller crystals on the surface of a large one leads ultimately to a decrease in the roughness and hence to a decrease in the cutting space. This is to be especially avoided.

In the method according to the invention, as high a substrate temperature as possible is established, in particular a temperature of from 900° C. to 1000° C. This is very high in comparison with a known coating of hard metal with a smooth diamond layer. For the coating process, a proportion of methane preferably of about 1.0% to 1.2% is established. To obtain a larger proportion of graphitically bonded carbon between the diamond grains, the proportion of methane can be further increased. The proportion of graphitically bonded carbon inserted in the diamond layer can be adjusted through the proportion of methane. For the variables given above, for example, roughness values of $R_a=10$ μm at a layer thickness of 20 μm to 30 μm are established for a tool. If such a grinding tool is used for grinding corundum, a roughness of about $R_z=5$ μm is produced on the workpiece.

BRIEF DESCRIPTION OF THE DRAWINGS

To explain the invention in more detail, in the Examples below a method for the manufacture of a coating on a grinding tool is described with the aid of drawings. These show:

FIG. 1 shows a sketch of the principle of the procedure for coating a grinding tool having a body. The detail illustrates a body 1 with smooth surface 2. In processing step I, the smooth body 1 is roughened. This is achieved by working with a diamond tool 3. The diamond tool 3 may, for example, be a file or a lapping wheel. A brush may also be used with advantage. It is advantageous that both the tile and the lapping wheel have diamond grains 4 of course grain size, for example, a grain size of 213 μm.

Figure 1:
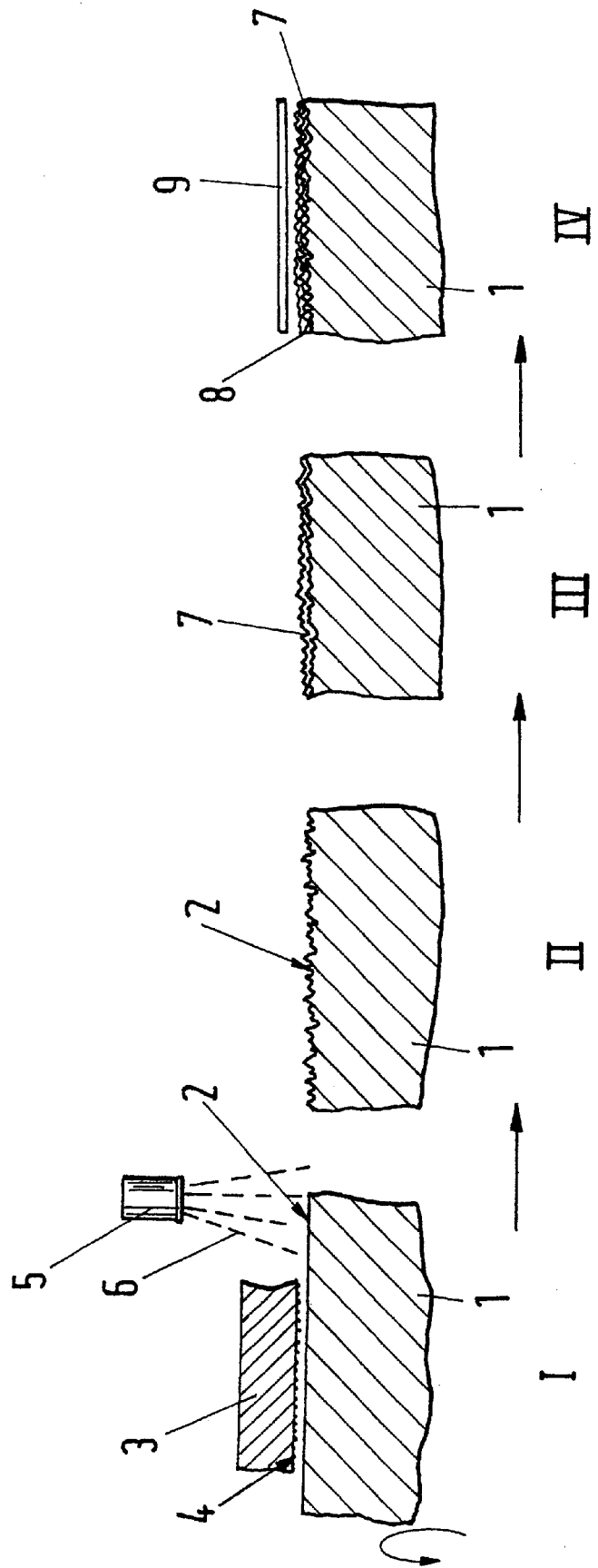
in FIG. 1 is a sketch of the principle of the procedure for coating a grinding tool, in FIG. 2 is a schematic section through the surface of a tool having a roughening body, coated by the method according to the invention, in FIG. 3 is a schematic sectional view through a second embodiment of a tool having a smooth body, coated by the method according to the invention, and in FIG. 4 is a sketch of the principle of diamond crystals and a proportion of graphite deposited according to the invention.

As an alternative to working with a diamond tool 3, the body may also be sandblasted. This is depicted in FIG. 1 by a nozzle 5 and sand 6. The body 1 is preferably rotated during the roughening treatment, to render possible optimal working all over.

The tool may, for example, be a conventional tool for honing or else a pin, a cutting-off wheel of the like.

By being worked with the diamond tool or by being sandblasted, the body 1 acquires the roughened surface 2 shown in processing step II. For coating with the diamond layer by the CVD process it is not however necessary to roughen the body in the manner shown in processing step I. This roughening proves to be advantageous for improving the bonding of the diamond layer applied and for the preliminary nucleation of the surface of the body.

To further improve the bonding of the diamond layer to be applied in processing step IV, in processing step III the roughened body is advantageously provided with an intermediate layer 7. The intermediate layer 7 advantageously prevents or lessens a gaseous evolution of carbon when, for example, graphite is used as the body. The intermediate layer 7 is therefore dense and simplifies the deposition of diamond onto the body 1. If other bodies, for example steel, are used, an intermediate layer 7 can also lessen the diffusion of such elements to the surface; such diffusion inhibits the diamond growth. The surface of the intermediate layer is preferably also rough and hence enhances the roughness of the surface of the body. The intermediate layer is advantageously also prenucleated after application. It can be a layer of platinum and/or gold, for example.

In processing step IV, the actual coating with a diamond layer 8 takes place. The prepared body 1 is inserted into a device for carrying out a vapor phase deposition or Chemical Vapor Deposition (CVD) process. Preferably a hot Filament Chemical Vapor Deposition (HF-CVD) process is carried out. Of such a device for carrying out the vapor-phase deposition process, only a filament 9 is shown. The substrate temperature chosen for the coating process is very high compared with that used for the diamond coating of hard metal. Temperature of preferably 900° C. to 1000° C. are chosen. Through variation of the proportion of methane during the vapour-phase deposition, the composition of the diamond coating can be varied in relation to the proportions of graphitically bonded carbon possibly present and/or intended.

Figure 2:
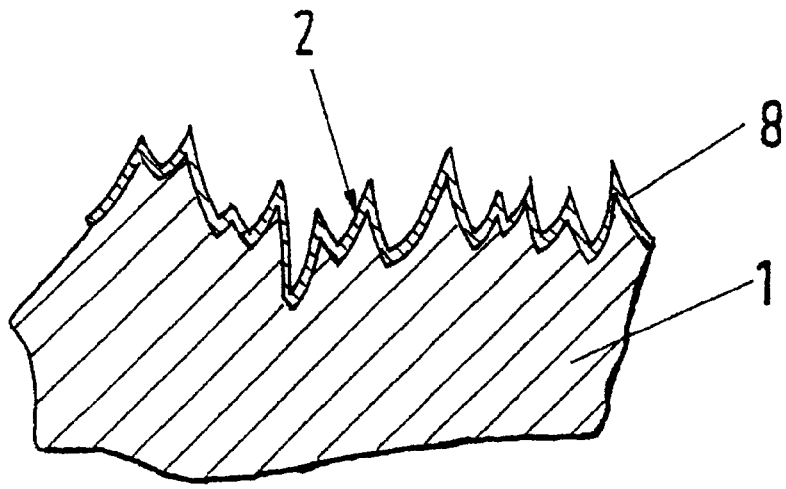

FIG. 2 shows in section a schematic detail of a tool coated by the process shown in FIG. 1. Through having been roughened, the body 1 has on its surface 2 points and teeth. These are covered by the diamond coating 8. The points and teeth present an irregular degree of roughness, which is not compensated for nor appreciably levelled out by the coating. On the contrary, this roughness is further reinforced by the consistency and nature of the diamond coating.

The diamond layer serves on the one hand to remove chips on the surface of the workpiece and on the other hand also to protect the surface of the body from wear. The body is roughened to just such an extent that the diamond layer bonds well thereto and the tolerance to be met by the tool for use as a precision tool are not exceeded.

Instead of using the processing step I shown in FIG. 1 to achieve a roughened surface on the body, choosing a porous body is also a preferred possibility. The surface of the latter has a profile similar to that of the roughened surface 2 of the body 1 shown in FIG. 2. The porosity chosen should on the whole be as high as possible, and in particular 12% to 15%.

The material chosen for the body is advantageously a material having a low coefficient of expansion, in particular a coefficient of expansion of $1.3 \cdot 10^{-6}$ 1/K to $1.6 \cdot 10^{-6}$ 1/K, in order to achieve optimal success in the coating process even at the high coating temperatures used.

Diamond has a very low coefficient of expansion, of about $1 \cdot 10^{-6}$ 1/K. Because of this, after the coating at high temperatures and subsequent cooling to room temperature, considerable heat stresses arise if the coefficient of expansion of the body is not correspondingly low. These stresses can become so great that they give rise to unwanted peeling of the coating if the bonding of the layer to the body is not optimal.

Figure 3:
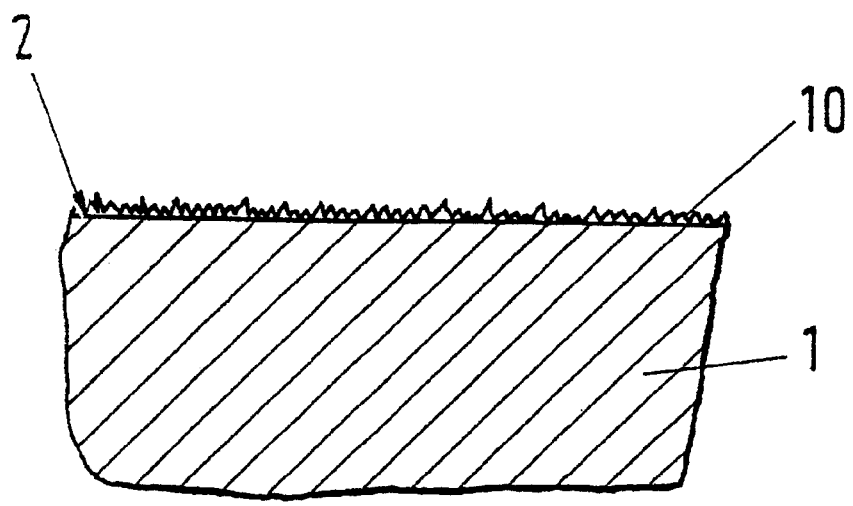

FIG. 3 shows a second embodiment of a coating produced according to the invention on a tool having a smooth body 1. A rough diamond layer 10 is deposited onto the smooth body. The rough diamond layer is applied in such a way that as many points as possible are exposed. Such a texture is graded as (111) or (110). The cutting space required for the chip removal is provided in the diamond layer illustrated by the interstices between the actual crystals. Such a grinding tool is particularly suitable for the fine machining of workpieces. To the person skilled in the art, it is astonishing that any grinding is possible at all by means of a diamond layer deposited on a smooth body by a vapour-phase deposition process. A person skilled in grinding would on the one hand consider the roughness of a diamond layer deposited by the vapor-phase deposition process to be too low compared with conventional tools and on the other hand would find fault with the lack of a so-called binder phase, such as is provided in conventional tools for an intended amount of wearing away.

Figure 4:
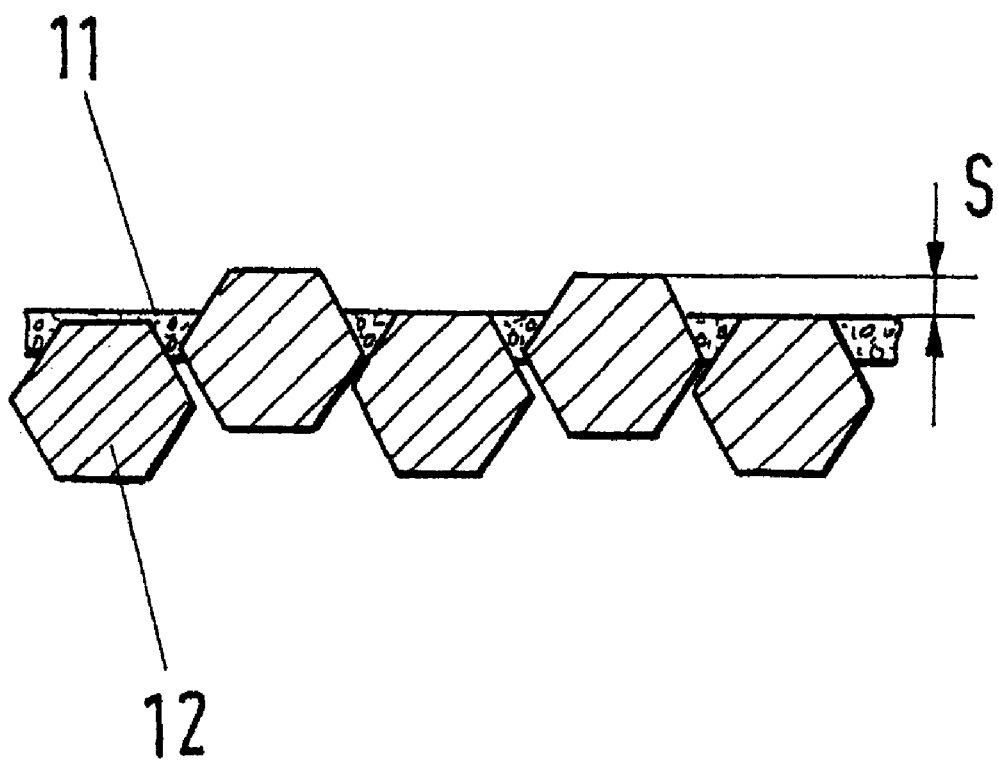

To promote bonding of the diamond layer to the smooth body, the latter is first of all advantageously prenucleated prior to the vapor-phase deposition. In the embodiment shown in FIG. 3, a closed diamond layer free from phase shift and without additions such as, for example, cobalt, is deposited directly onto the body. In the vapor-phase deposition process, graphitically bonded carbon can also be incorporated into the CVD diamond layer. An embodiment of this kind is sketched schematically in FIG. 4. Such a layer 11 of graphitically bonded carbon rearranges the individual diamond crystals 12. The cutting space S is produced by the respective upper delimitation of the diamond crystals 12 and the layer 11 consisting of graphitically bonded carbon.

The graphitically bonded carbon, compared with the diamond layer, is worn away very rapidly and gradually releases further now cutting space between the diamond crystals.

The proportion of graphitically bonded carbon in the diamond layer can be adjusted by appropriate variation of the proportion of methane during the vapour-phase deposition. For example, the proportion of methane during the vapor-phase deposition is about 1.0% to 1.2%. In the vapor-phase deposition the variables to be adjusted, such as time, temperature, proportions of vapour et. cetera, are so chosen that, as shown ideally in FIG. 4, as far as possible only large crystals 12 grow. Growth of smaller crystals, namely by secondary nucleation, on the surface of the large diamond crystals 12 is also possible. But this would lead to a decrease in the roughness of the diamond layer and hence also to a decrease in the available cutting space S, which is undesirable.

The diamond layer initially grows in pure phase manner. A good bonding of the diamond layer to the body is thereby obtained. Not until the diamond layer is completely closed and a diamond layer already of about 2 $\mu$m in thickness has grown, is the vapor-phase altered while the deposition process is in progress. The alteration is intended to provide that the graphitically bonded carbon and diamond are deposited equally. The advantageous effect of the continuous creation of cutting space is thereby achieved.

By means of the method according to the invention, for example, roughness values of $R_z=10$ $\mu$m and a layer thickness of the diamond layer of 20 $\mu$m to 30 $\mu$m can be produced on tools. When used for grinding a workpiece made of corundum, grinding tools having a roughness value of $R_z=10$ $\mu$m can produce, for example, a roughness $R_z=5$ $\mu$m on this workpiece. Hence the resulting roughness value of the workpiece is about one half relative to the roughness value of the tool.

Through the above roughening of a smooth body by means of a diamond tool, for example, a lapping wheel having a large grain size, it is possible to dispense with one processing stop, namely the preliminary nucleation. This saves time and costs during the manufacture of the coating for the grinding tool.

List of Reference Numbers

1 Body
2 Surface
3 Diamond cool S Cutting space
4 Diamond grains
5 Nozzle
6 Sand
7 Intermediate layer
8 Diamond layer
9 Filament
10 Diamond layer
11 Layer of graphitically bonded carbon
12 Diamond crystal

We claim:

1. A method for the manufacture of a coating on a grinding tool, whereby a rough diamond layer is produced as an abrasive layer on a surface of a body of the grinding tool by vapor-phase deposition and whereby this diamond layer is deposited on the grinding tool by the Hot Filament Chemical Vapor Deposition (HF-CVD) process.

2. The method of claim 1, wherein the diamond layer is deposited directly as a closed layer, of a pure phase, onto the body of the grinding tool.

3. The method of claim 1, wherein the diamond layer is deposited together with small quantities of graphitically bonded carbon onto the body of the grinding tool.

4. The method of claim 1, wherein the surface of the body is rough.

5. The method of claim 4, wherein granular diamond material or a diamond tool is used to roughen the surface of the body.

6. The method of claim 4, wherein the surface of the body is roughened by means of a lapping wheel having a large grain size.

7. The method of claim 4, wherein, prior to being coated, the body is sandblasted.

8. The method of claim 1, wherein the surface of the body is roughened to just such an extent that the diamond layer bonds well and the tolerances to be met by the tool are not exceeded.

9. The method of claim 1, wherein the texture of the diamond layer is adjusted so that as many points as possible are exposed, corresponding to a (111) or (110) texture.

10. The method of claim 1, wherein individual diamond crystals of the diamond layer grow as large as possible.

11. The method of claim 10, wherein a secondary nucleation is avoided.

12. The method of claim 1, wherein a substrate temperature of T=900° C. to 1000° C. is established and that a proportion of methane of 1.0% to 1.2% is established.

13. The method of claim 12, wherein a proportion of graphitically bonded carbon inserted in the diamond layer is adjusted by altering a proportion of methane in the vapor-phase deposition.

14. The method of claim 1, wherein a thickness of the diamond layer is made homogeneous by altering the coating temperature, coating time and composition of the vapor.

15. The method of claim 1, wherein, in a first step, the diamond layer grows in a pure phase manner onto the body and that, with a completely closed diamond layer and a layer thickness of approximately 2 $\mu$m during the course of the vapor-phase deposition process, the vapor phase is altered in such a way that graphitically bonded carbon and diamond are deposited at the same time.

16. The method of claim 1, wherein the coated grinding tools are conventional tools.

17. The method of claim 4, wherein the surface of the body is porous.

18. The method of claim 6, wherein the surface of the body is roughened by means of a lapping wheel having a grain size of approximately >>10 $\mu$m.

19. The method of claim 6, wherein the surface of the body is roughened by a rolling process.

20. The method of claim 1, wherein the material chosen for the body has a porosity of 12% to 15%.

21. The method of claim 1, wherein the material chosen for the body has a coefficient of expansion of $1.3 \times 10^{-6}$ 1/K to $1.6 \times 10^{-6}$ 1/K.

22. The method of claim 16, wherein the conventional tools are selected from the group consisting of pins, cutting-off wheels, and tools for honing.

* * * * *